(12) United States Patent
Yang et al.

(10) Patent No.: US 12,148,871 B2
(45) Date of Patent: Nov. 19, 2024

(54) DISPLAY DEVICE

(71) Applicant: Samsung Display Co., Ltd., Yongin-Si (KR)

(72) Inventors: Shinhyuk Yang, Seongnam-si (KR);
Jeehoon Kim, Cheonan-si (KR);
Kyumin Kim, Suwon-si (KR);
Jongmoo Huh, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 526 days.

(21) Appl. No.: 17/565,088

(22) Filed: Dec. 29, 2021

(65) Prior Publication Data
US 2022/0384696 A1    Dec. 1, 2022

(30) Foreign Application Priority Data
Jun. 1, 2021  (KR) .......................... 10-2021-0071018

(51) Int. Cl.
*H01L 33/62* (2010.01)
*H01L 33/38* (2010.01)

(52) U.S. Cl.
CPC ............ *H01L 33/62* (2013.01); *H01L 33/382* (2013.01)

(58) Field of Classification Search
CPC .................. H10K 59/80517; H10K 59/80518
See application file for complete search history.

(56) References Cited

U.S. PATENT DOCUMENTS

| | | | |
|---|---|---|---|
| 2004/0140758 A1 | 7/2004 | Raychaudhuri et al. | |
| 2008/0218091 A1* | 9/2008 | Jo ......................... | H10K 59/131 445/24 |
| 2011/0084257 A1* | 4/2011 | Kwon .............. | H10K 59/80518 257/89 |
| 2013/0015456 A1* | 1/2013 | You ....................... | H01L 27/124 257/E33.053 |
| 2013/0112975 A1* | 5/2013 | Choi ................... | H10K 59/1216 438/34 |
| 2015/0097160 A1* | 4/2015 | Kim ...................... | H10K 59/123 438/23 |
| 2015/0102316 A1* | 4/2015 | Park ...................... | H10K 50/856 257/40 |
| 2016/0351651 A1* | 12/2016 | Jang ................. | H10K 59/80518 |
| 2018/0151828 A1* | 5/2018 | Im ........................ | H10K 50/805 |

\* cited by examiner

*Primary Examiner* — Evren Seven
(74) *Attorney, Agent, or Firm* — Innovation Counsel LLP

(57) ABSTRACT

A display device includes a driving element disposed in a display area, an emission element disposed in the display area and electrically connected to the driving element, and a connection pad disposed in a pad area adjacent to the display area and electrically connected to the driving element. The connection pad includes a first pad conductive layer including a metal and a second pad conductive layer including indium tin zinc oxide (ITZO). The indium tin zinc oxide of the second pad conductive layer includes about 20 at % to about 35 at % of indium (In), about 2 at % to about 20 at % of zinc (Zn), about 4 at % to about 6 at % of tin (Sn), and a remainder of oxygen (O).

20 Claims, 12 Drawing Sheets

DISPLAY DEVICE

CROSS-REFERENCE TO RELATED APPLICATION

This application claims priority from and the benefit of Korean Patent Application No. 10-2021-0071018, filed on Jun. 1, 2021, which is hereby incorporated by reference for all purposes as if fully set forth herein.

BACKGROUND

1. Field

The present disclosure generally relates to a display device. More particularly, the present disclosure relates to a display device including a pad area.

2. Description of the Related Art

A display device is a device that visually displays data. The display device may include a substrate divided into a display area and a non-display area. Scan lines and data lines may be disposed in the display area, and a plurality of pixels may be disposed in the display area. In addition, each of the pixels may include a driving element and an emission element electrically connected to the driving element. Various lines for transmitting electrical signals, a scan driver, a data driver, a controller, a pad, and the like may be disposed in the non-display area.

SUMMARY

Embodiments provide a display device capable of reducing defects in a display area.

A display device according to an embodiment may include a driving element disposed in a display area, an emission element disposed in the display area and electrically connected to the driving element, and a connection pad disposed in a pad area adjacent to the display area and electrically connected to the driving element. The connection pad may include a first pad conductive layer having a metal and a second pad conductive layer having indium tin zinc oxide (ITZO). The indium tin zinc oxide of the second pad conductive layer may include about 20 at % to about 35 at % of indium (In), about 2 at % to about 20 at % of zinc (Zn), about 4 at % to about 6 at % of tin (Sn), and a remainder of oxygen (O).

In an embodiment, the emission element may include a lower electrode disposed on the driving element, an emission layer disposed on the lower electrode, and an upper electrode disposed on the emission layer.

In an embodiment, the lower electrode may include a lower layer including indium tin zinc oxide, an intermediate layer disposed on the lower layer and including silver (Ag), and an upper layer disposed on the intermediate layer and including indium tin zinc oxide.

In an embodiment, a composition ratio of the indium tin zinc oxide included in each of the lower layer and the upper layer may have a same as a composition ratio of the indium tin zinc oxide of the second pad conductive layer.

In an embodiment, a thickness of the lower layer may be about 30 Å to about 300 Å. A thickness of the upper layer may be about 30 Å to about 500 Å. A thickness of the second pad conductive layer may be about 30 Å to about 2,000 Å.

In an embodiment, the indium tin zinc oxide of each of the upper layer, the lower layer, and the second pad conductive layer may be amorphous.

In an embodiment, the first pad conductive layer may include titanium (Ti) and copper (Cu).

In an embodiment, the second pad conductive layer may further include titanium.

In an embodiment, the driving element may include an active layer, a gate electrode disposed on the active layer, and a source pattern and a drain pattern disposed on the gate electrode, each of the source pattern and the drain pattern connected to the active layer through contact holes penetrating an interlayer insulating layer.

In an embodiment, the drain pattern may include a drain layer having a same material as the first pad conductive layer, and a conductive layer disposed on the drain layer and having a same material as the second pad conductive layer.

In an embodiment, the display device may further include an inorganic insulating layer disposed on the driving element and the connection pad, and covering the driving element and an organic insulating layer disposed on the inorganic insulating layer. The second pad conductive layer may have an exposed portion through an opening formed by removing a portion of the organic insulating layer.

A display device according to an embodiment may include a driving element disposed in a display area, a lower electrode disposed on the driving element, and a connection pad disposed in a pad area adjacent to the display area and electrically connected to the driving element. The lower electrode may include a lower layer and an upper layer each having indium tin zinc oxide and an intermediate layer having silver. The connection pad may include a first pad conductive layer having a metal and a second pad conductive layer having indium tin zinc oxide in a same composition ration as indium tin zinc oxide of the lower electrode.

In an embodiment, the indium tin zinc oxide of each of the lower layer, the upper layer and the second pad conductive layer may include about 20 at % to about 35 at % of indium, about 2 at % to about 20 at % of zinc, about 4 at % to about 6 at % of tin, and a remainder of oxygen.

In an embodiment, the indium tin zinc oxide of each of the lower layer, the upper layer and the second pad conductive layer may be amorphous.

In an embodiment, the first pad conductive layer may include titanium and copper.

In an embodiment, the second pad conductive layer may further include titanium.

In an embodiment, the display device may further include an emission layer disposed on the lower electrode and an upper electrode disposed on the emission layer. The lower electrode, the emission layer and the upper electrode may be defined as an emission element.

In an embodiment, a thickness of the lower layer is about 30 Å to about 300 Å, a thickness of the upper layer is about 30 Å to about 500 Å, and a thickness of the second pad conductive layer is about 30 Å to about 2,000 Å.

In an embodiment, the driving element may include an active layer, a gate electrode disposed on the active layer, and a source pattern and a drain pattern disposed on the gate electrode, each of the source pattern and the drain pattern connected to the active layer through contact holes penetrating a interlayer insulating layer.

In an embodiment, the drain pattern may include a drain layer including a same material as the first pad conductive layer, and a conductive layer disposed on the drain layer and having a same material as the second pad conductive layer.

A display device according to an embodiment may include a lower electrode including indium tin zinc oxide and a connection pad including indium tin zinc oxide in the same composition ratio as a composition ratio of indium tin zinc oxide of the lower electrode. Accordingly, defects of the display device may be improved.

BRIEF DESCRIPTION OF THE DRAWINGS

Illustrative, non-limiting embodiments will be more clearly understood from the following detailed description in conjunction with the accompanying drawings.

DETAILED DESCRIPTION OF THE EMBODIMENTS

Figure 1:
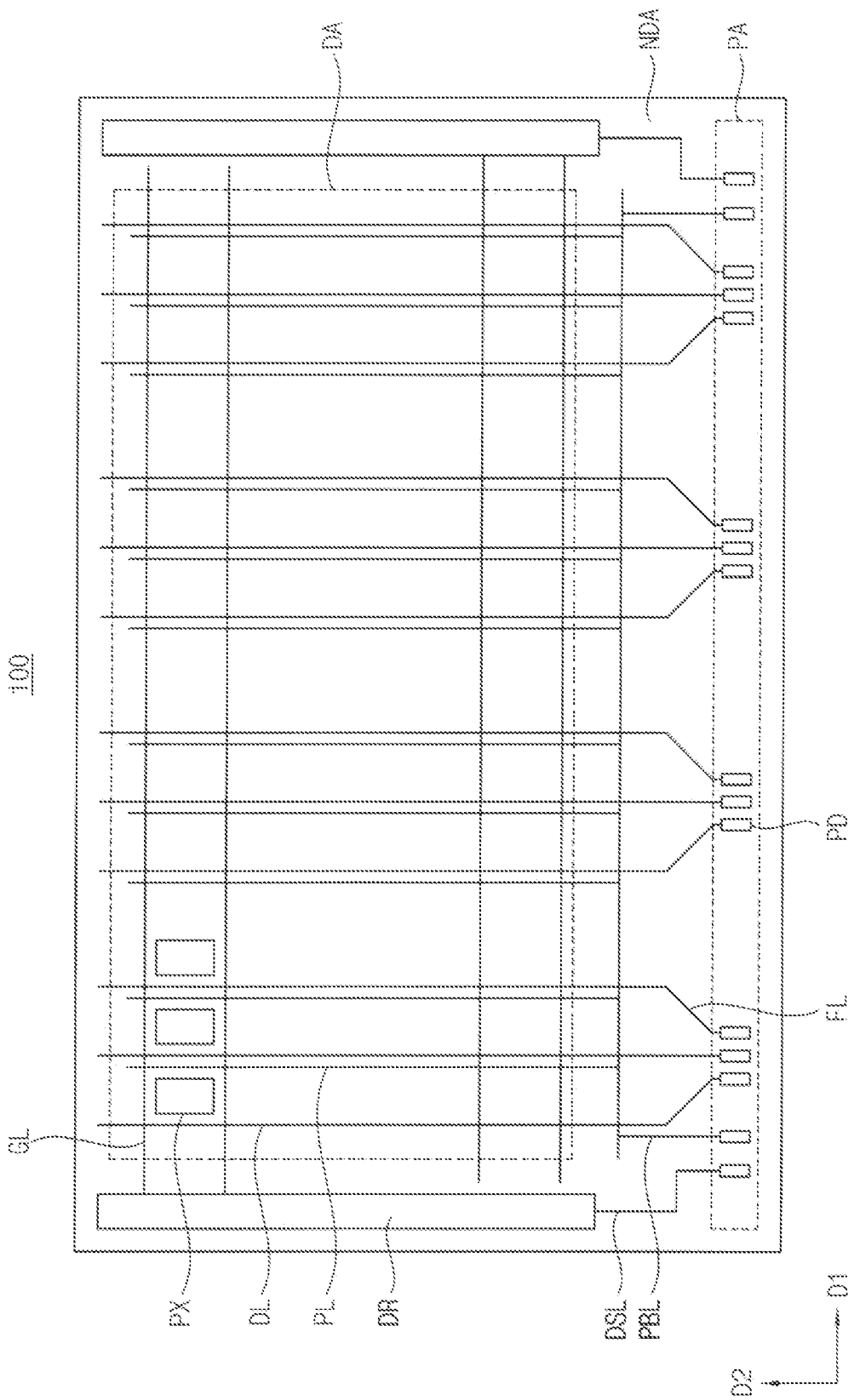
FIG. 1 is a plan view illustrating a display device according to an embodiment.

Hereinafter, embodiments of the present disclosure will be explained in detail with reference to the accompanying drawings. The same reference numerals are used for the same components in the drawings, and redundant descriptions of the same components will be omitted.

FIG. 1 is a plan view illustrating a display device according to an embodiment.

Referring to FIG. 1, the display device 100 may include a display area DA and a non-display area NDA. The non-display area NDA may surround at least a portion of the display area DA. The display area DA may be defined as an area capable of displaying an image by generating light or adjusting transmittance of light provided from an external light source. The non-display area NDA may be defined as an area that does not display an image.

Pixels PX each including an emission element and a driving element may be disposed in the display area. The pixels PX may generate light according to a driving signal. A signal line providing the driving signal to the pixels PX and a power line providing power may be disposed in the display area DA. For example, a gate line GL providing a gate signal to the pixels PX, a data line DL providing a data signal to the pixels PX, and a power line PL providing a power to the pixels may be disposed in the display area DA. The gate line GL may be extended in a first direction D1, the data line DL may be extended in a second direction D2 crossing the first direction D1, and the power line PL may be extended in the second direction D2.

A circuit portion for generating a driving signal and a transmission line for transmitting a driving signal or power to the display area DA or a control signal to the circuit portion may be disposed in the non-display area NDA. For example, a driver DR generating the gate signal, a control signal line DSL transmitting the control signal to the driver DR, a fan-out line FL transmitting the data signal to the data line DL, a power transmission line PBL transmitting the power to the power line PL, and the like may be disposed in the non-display area NDA.

The non-display area NDA may include a pad area PA in which a connection pad PD is disposed. The connection pad PD disposed in the pad area PA may be plural in numbers. For example, the pad area PA may have a shape extending along one side of the display device 100. In other words, the pad area PA may have a shape extending in the first direction D1.

The transmission line may be extended to the pad area PA, and the connection pad PD may be electrically connected to the transmission line. For example, the connection pad PD may be electrically connected to at least one of the control signal line DSL, the fan-out line FL, and the power transmission line PBL.

A driving device may be bonded to the connection pad PD. Accordingly, the transmission line may be electrically connected to the driving device to receive the driving signal, the power, and the like from the driving device. For example, the driving device may be a flexible printed circuit board or a printed circuit board on which a driving chip is mounted. The driving device may be directly bonded to the pad area PA. Alternatively, the driving device may be electrically connected to the connection pad PD of the pad area PA through a connection member such as a flexible circuit film.

Figure 2:
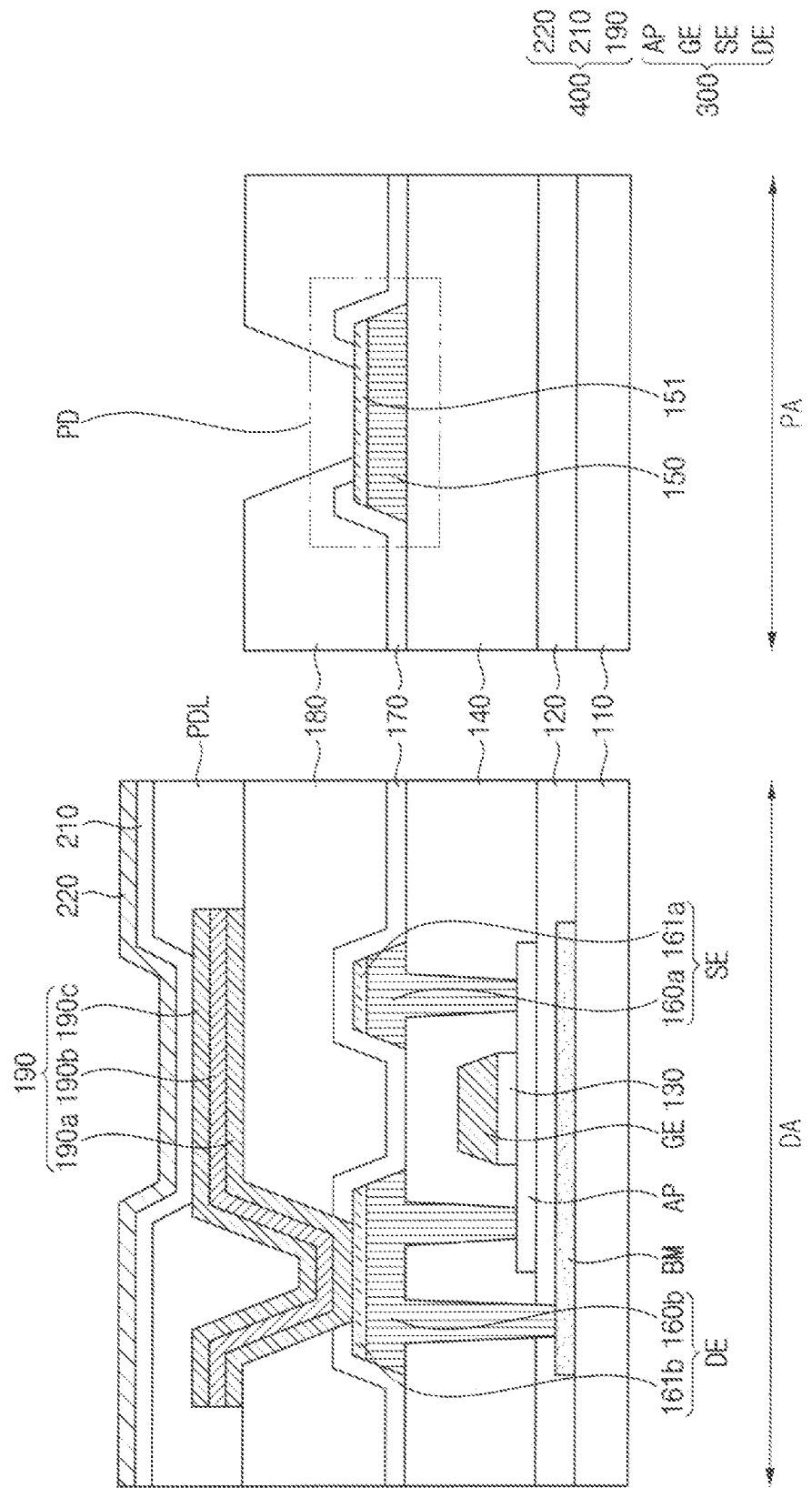
FIG. 2 is a cross-sectional view illustrating a display area and a pad area of the display device of FIG. 1.

FIG. 2 is a cross-sectional view illustrating a display area and a pad area of the display device of FIG. 1.

Referring to FIG. 2, the display device 100 may include a substrate 110, a buffer layer 120, a metal layer BM, a driving element 300, a gate insulating layer 130, an interlayer insulating layer 140, a protective layer 170, a planarization layer 180, an emission element 400, a connection pad PD, a pixel defining layer PDL, and the like. The driving device 300 may include an active layer AP, a gate electrode GE, a source pattern SE, and a drain pattern DE. The emission element 400 may include a lower electrode 190, an emission layer 210, and an upper electrode 220.

The substrate 110 including a transparent or opaque material may be provided. The substrate 110 may be divided into a display area DA and a pad area PA. The substrate 110 may be formed of a transparent resin substrate. An example of the transparent resin substrate that can be used as the substrate 110 may be a polyimide substrate. In this case, the polyimide substrate may include a first polyimide layer, a barrier film layer, a second polyimide layer, and the like. In another embodiment, the substrate 110 may include a quartz substrate, a synthetic quartz substrate, a calcium fluoride substrate, a fluorine-doped quartz substrate, a soda lime glass substrate, non-alkali glass substrate, and the like. These may be used alone or in combination with each other.

The metal layer BM may be disposed in the display area DA on the substrate 110. The metal layer BM may prevent the active layer AP from being deteriorated by light exposure. In addition, the metal layer BM may be connected to another line to receive a constant voltage, and the like. The metal layer BM may include a metal, an alloy, a metal nitride, a conductive metal oxide, a transparent conductive material, and the like. Examples of materials that can be used for the metal layer BM may be gold (Au), silver (Ag), aluminum (Al), tungsten (W), copper (Cu), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), alloy containing aluminum, aluminum nitride (AlN), alloy containing silver, tungsten nitride (WN), alloy containing copper, alloy containing molybdenum, titanium nitride (TiN), chromium nitride (CrN), tantalum nitride (TaN), strontium ruthenium oxide (SrRuO), zinc oxide (ZnO), indium tin oxide (ITO), tin oxide (SnO), indium oxide (InO), gallium oxide (GaO)), indium zinc oxide (IZO), and the like. These may be used alone or in combination with each other. In another embodiment, the metal layer BM may have a multilayer structure including a plurality of metal layers. For example, the metal layers may have different thicknesses or may include different materials.

The buffer layer 120 may be disposed on the substrate 110. The buffer layer 120 may be entirely disposed in the display area DA and the pad area PA. The buffer layer 120 may cover the metal layer BM. The buffer layer 120 may prevent diffusion of metal atoms or impurities from the substrate 110 to a semiconductor device. In addition, when a surface of the substrate 110 is not uniform, the buffer layer 120 may improve a flatness of the surface of the substrate 110. For example, the buffer layer 120 may include an organic material or an inorganic material.

The active layer AP may be disposed in the display area DA on the buffer layer 120. The active layer AP may overlap the metal layer BM. The active layer AP may include a metal oxide semiconductor, an inorganic semiconductor (e.g., amorphous silicon, polysilicon), or an organic semiconductor. The active layer AP may have a source region, a drain region, and a channel region. The channel region may be positioned between the source region and the drain region.

The gate insulating layer 130 may be disposed in the display area DA on the active layer AP. The gate insulating layer 130 may overlap the channel region of the active layer AR The gate insulating layer 130 may include a silicon compound, a metal oxide, and the like. Examples of the silicon compound that can be used for the gate insulating layer 130 may be silicon oxide ($SiO_x$), silicon nitride ($SiN_x$), silicon carbide ($SiC_x$), silicon oxycarbide ($SiO_xC_y$), silicon oxynitride ($SiO_xN_y$), silicon carbonitride ($SiC_xN_y$), and the like. In addition, examples of the metal oxide that can be used for the gate insulating layer 130 may be aluminum oxide (AlO), aluminum nitride (AlN), tantalum oxide (TaO), hafnium oxide (HfO), zirconium oxide (ZrO), titanium oxide (TiO), and the like. These may be used alone or in combination with each other. In another embodiment, the gate insulating layer 130 may have a multilayer structure including a plurality of insulating layers. For example, the insulating layers may have different thicknesses or may include different materials.

The gate electrode GE may be disposed in the display area DA on the gate insulating layer 130. The gate electrode GE may overlap the gate insulating layer 130. In addition, the gate electrode GE may overlap the channel region of the active layer AP. The gate electrode GE may include a metal, an alloy, a metal nitride, a conductive metal oxide, a transparent conductive material, and the like. These may be used alone or in combination with each other. In another embodiment, the gate electrode GE may have a multilayer structure including a plurality of metal layers. For example, the metal layers may have different thicknesses or may include different materials.

The interlayer insulating layer 140 may be disposed on the buffer layer 120 and the gate electrode GE. The interlayer insulating layer 140 may be entirely disposed in the display area DA and the pad area PA. The interlayer insulating layer 140 may sufficiently cover the active layer AP and the gate electrode GE on the buffer layer 120. The interlayer insulating layer 140 may include a silicon compound, a metal oxide, and the like. These may be used alone or in combination with each other. In another embodiment, the interlayer insulating layer 140 may have a multilayer structure, including a plurality of insulating layers. For example, the insulating layers may have different thicknesses or may include different materials.

The source pattern SE and the drain pattern DE may be disposed in the display area DA on the interlayer insulating layer 140. The source pattern SE may be connected to the source region of the active layer AP through a contact hole formed by removing a first portion of the interlayer insulating layer 140, and the drain pattern DE may be connected to the drain region of the active layer AP through a contact hole formed by removing a second portion of the interlayer insulating layer 140. In addition, the drain pattern DE may be connected to the metal layer BM through a contact hole formed by removing a third portion of the interlayer insulating layer 140 and the buffer layer 120. Each of the source pattern SE and the drain pattern DE may include a metal, an alloy, a metal nitride, a conductive metal oxide, a transparent conductive material, and the like. These may be used alone or in combination with each other.

The source pattern SE may include a source layer 160a and a first conductive layer 161a disposed on the source layer 160a. The drain pattern DE may include a drain layer 160b and a second conductive layer 161b disposed on the drain layer 160b. For example, each of the source layer 160a and the drain layer 160b may include a metal such as gold (Au), silver (Ag), aluminum (Al), tungsten (W), copper (Cu), platinum (Pt), nickel (Ni), titanium (Ti), and the like. Each of the first and second conductive layers 161a and 161b may include a transparent conductive material such as indium tin oxide (ITO), indium zinc oxide (EKG), zinc tin oxide (ZTO), indium oxide (InO), indium tin zinc oxide (ITZO), zinc oxide (ZnO), tin oxide (SnO), and the like. These may be used alone or in combination with each other.

In an embodiment, each of the source layer 160a and the drain layer 160b may include titanium and copper, and each of the first, and second conductive layers 161a and 161b may include indium tin zinc oxide. In another embodiment, each of the first and second conductive layers 161a and 161b may include titanium and iridium tin zinc oxide. The first conductive layer 161a may serve to prevent damage to the source layer 160a. The second conductive layer 161b may serve to prevent damage to the drain layer 160b.

The connection pad PD shown in FIG. 1 may be disposed in the pad area PA on the interlayer insulating layer 140. The connection pad PD may include a metal, an alloy, a metal nitride, a conductive metal oxide, a transparent conductive material, and the like. These may be used alone or in combination with each other. The connection pad PD may be electrically connected to the driving element 300.

The connection pad PD may include a first pad conductive layer 150 and a second pad conductive layer 151 disposed on the first pad conductive layer 150. For example, the first pad conductive layer 150 may include a metal such as gold, silver, aluminum, tungsten, copper, platinum, nickel, titanium, and the like. The second pad conductive layer 151 may include a transparent conductive material such as indium tin oxide, indium zinc oxide, zinc tin oxide, indium oxide, indium tin zinc oxide, zinc oxide, tin oxide, and the like. These may be used alone or in combination with each other.

In an embodiment, the first pad conductive layer 150 may include titanium and copper, and the second pad conductive layer 151 may include indium tin zinc oxide. In another embodiment, the second pad conductive layer 151 may include titanium and indium tin zinc oxide, That is, the first pad conductive layer 150 may be disposed on the same layer as the source layer 160a and the drain layer 160b and the second pad conductive player 151 may be disposed on the same layer as the first and second conductive layers 161a and 161b. In other word, the first pad conductive layer 150 may include the same material as the source layer 160a and the drain layer 161b, and the second pad conductive layer 151 may include the same material as the first and second conductive lavers 161a and 161b.

The second pad conductive, layer 151 may serve as a medium for electrically connecting the first pad conductive layer 150 to an external terminal.

In the conventional display device, since a second pad conductive layer of a connection pad includes indium tin oxide, crystallization of the indium tin oxide of the second pad conductive layer occurs during a manufacturing process of a lower electrode. Accordingly, a pin hole is formed in the connection pad, and copper erosion occurs in the connection pad due to the pin hole.

In an embodiment, when the second pad conductive layer 151 includes indium tin zinc oxide, the indium tin zinc oxide of the second pad conductive layer 151 may be amorphous. When the indium tin zinc oxide of the second pad conductive layer 151 is amorphous, the pin hole may not be formed in the connection pad PD. Accordingly, copper may be not eroded in the connection pad PD, and defects of the display device 100 may be improved.

In an embodiment, a thickness of each of the first conductive layer 161a, the second conductive layer 161b, and the second pad conductive layer 151 may be about 30 Å to 2,000 Å.

In one embodiment, when each of the first conductive layer 161a, the second conductive layer 161b, and the second pad conductive layer 151 includes indium tin zinc oxide, the indium tin zinc oxide of each of the first conductive layer 161a, the second conductive layer 161b and the second pad conductive layer 151 may include about 20 at % to about 35 at % of indium (In), about 2 at % to about 20 at % of zinc (Zn), about 4 at % to about 6 at % of tin (Sn) and a remainder of oxygen (O). Preferably, the indium tin zinc oxide of each of the first conductive layer 161a, the second conductive layer 161b, and the second pad conductive layer 151 may include about 21 at % to about 34 at % of indium (In), about 3 at % to about 18 at % of zinc (Zn), about 4 at % to about 6 at % of tin (Sn), and a remainder of oxygen (O). When the indium tin zinc oxide of each of the first conductive layer 161a, the second conductive layer 161b, and the second pad conductive layer 151 includes more than about 6 at % of tin (Sn), a tip may be generated in the connection pad PD.

The protective layer 170 may be disposed on the interlayer insulating layer 140. The protective layer 170 may be entirely disposed in the display area DA and the pad area PA. The protective layer 170 may cover the source pattern SE, the drain pattern DE, and the connection pad PD. The protective layer 170 may protect the source pattern SE, the drain pattern DE, and the connection pad PD. For example, the protective layer 170 may include a silicon compound a metal oxide, and the like. These may be used alone or in combination with each other. The protective layer 170 may be referred to as an inorganic insulating layer.

The planarization layer 180 may be disposed on the passivation layer 170. The planarization layer 180 may be entirely disposed in the display area DA and the pad area PA. The planarization layer 180 may include an inorganic material or an inorganic material. In an embodiment, the planarization layer 180 may include an organic material. Examples of the organic material that can be used for the planarization layer 180 may be a photoresist, a polyacryl-based resin, a polyimide-based resin, a polyamide-based resin, a siloxane-based resin, an acryl-based resin, an epoxy-based resin, and the like. These may be used alone or in combination with each other. The planarization layer 180 may be referred to as an organic insulating layer.

The lower electrode 190 may be disposed in the display area DA on the planarization layer 180. The lower electrode 190 may be connected to the drain pattern DE through a contact hole formed by removing a portion of the planarization layer 180 and the protective layer 170. Specifically, the lower electrode 190 may be connected to the second conductive layer 161b of the drain pattern DE through the contact hole. The lower electrode 190 may be an anode electrode.

In an embodiment, the lower electrode 190 may include a lower layer 190a disposed on the planarization layer 180, an intermediate layer 190b disposed on the lower layer 190a, and an upper layer 190c disposed on the intermediate layer 190b. Each of the lower layer 190a and the upper layer 190c may include a metal oxide such as indium tin oxide, indium zinc oxide, zinc tin oxide, indium oxide, indium tin zinc oxide, zinc oxide, tin oxide, and the like. These may be used alone or in combination with each other. In an embodiment, each of the lower layer 190a and the upper layer 190c may include indium tin zinc oxide. In addition, when each of the lower layer 190a and the upper layer 190c includes indium tin zinc oxide, the indium tin zinc oxide of each of the lower layer 190a and the upper layer 190c may be amorphous.

The intermediate layer 190b may include a metal such as gold, silver, aluminum, copper, nickel, platinum, magnesium, chromium, tungsten, molybdenum, titanium, and the like. These may be used alone or in combination with each other. In an embodiment, the intermediate layer 190b may include silver.

In an embodiment, a thickness of the lower layer 190a may be about 30 Å to about 500 Å, and a thickness of the upper layer 190c may be about 30 Å to about 300 Å.

In an embodiment, the lower electrode 190 may include indium tin zinc oxide in the same composition ratio as indium tin zinc oxide of each of the first conductive layer 161a, the second conductive layer 161b, and the second pad conductive layer 151. Specifically, each of the lower layer 190a and the upper layer 190c may include indium tin zinc oxide in the same composition ratio as indium tin zinc oxide of each of the first conductive layer 161a, the second conductive layer 161b, and the second pad conductive layer 151. That is, the indium tin zinc oxide of each of the lower layer 190a and the upper layer 190c may include about 20 at % to about 35 at % of indium, about 2 at % to about 20 at % of zinc, about 4 at % to about 6 at % of tin, and the remaining oxygen.

The pixel defining layer PDL may be disposed in the display area DA on the planarization layer 180 and the lower electrode 190. The pixel defining layer PDL may cover both sides of the lower electrode 190 and may expose a portion of an upper surface of the lower electrode 190. The pixel defining layer PDL may include an organic material or an inorganic material. In an embodiment, the pixel defining layer PDL may include an organic material.

The emission layer 210 may be disposed on the lower electrode 190 and the pixel defining layer PDL. The emission layer 210 may emit red, green, or blue light. Alternatively, when the emission layer 210 emits white light, the emission layer 210 may include a multilayer structure including a red emission layer, a green emission layer, and a blue emission layer, or a mixed layer of red, green, and blue light emitting materials. The emission layer 210 may include a hole injection layer (HIL), a hole transporting layer (HTL), am organic emission layer (EML), an electron transporting layer (ETL) and an electron injection layer (EIL). For example, the emission layer 210 may include a low molecular weight organic compound or a high molecular weight organic compound.

The upper electrode 220 may be disposed on the emission layer 210. The upper electrode 220 may include a metal, an alloy, a metal nitride, a conductive metal oxide, a transparent conductive material, and the like. These may be used alone or in combination with each other. In another embodiment, the upper electrode 220 may have a multilayer structure including a plurality of metal layers. For example, the metal layers may have different thicknesses or may include different materials. The upper electrode 220 may be a cathode electrode.

In the conventional display device, each of a lower electrode and a connection pad includes indium tin oxide. In this case, a pin hole is formed in a portion of the connection pad during a manufacturing process of the lower electrode. Copper is eroded from the portion of the connection pad due to the pinhole, and silver is eluted from a portion of the lower electrode. That is, the display device may be defective due to the pinhole.

The display device 100 of the present disclosure may include the lower electrode 190 including indium tin zinc oxide and the connection pad PD including indium tin zinc oxide in the same composition ratio as a composition ratio of indium tin zinc oxide of the lower electrode 190. Accordingly, defects of the display device 100 may be improved.

However, although the display device 100 of the present disclosure is described by limiting an organic light emitting display device, the configuration of the present disclosure is not limited thereto. In another embodiment, the display device 100 may include a liquid crystal display device (LCD), a field emission display device (FED), a plasma display device (PDP), or an electrophoretic image display device (EPD).

Figure 3:
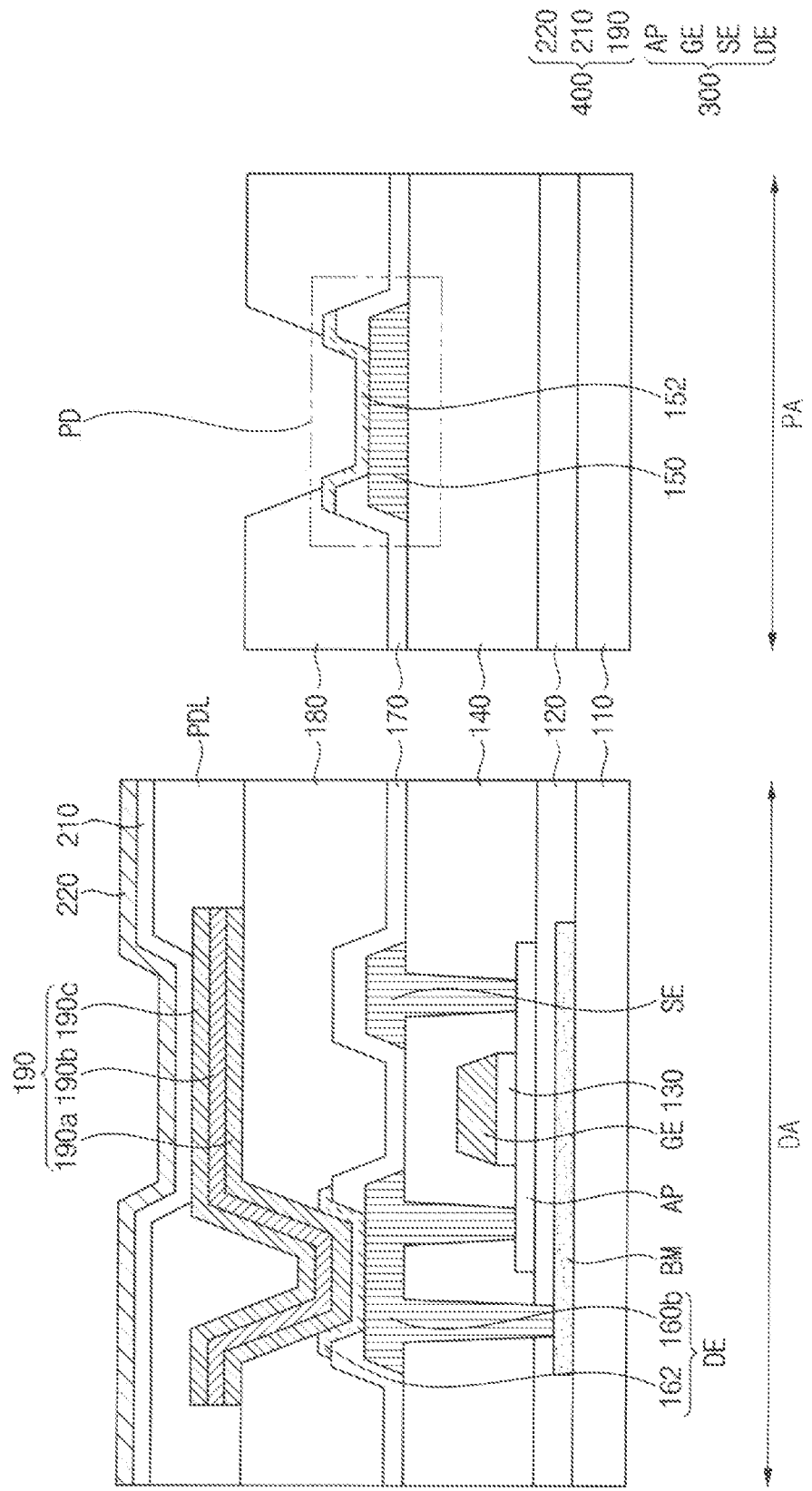
FIG. 3 is a cross-sectional view illustrating a display area and a pad area of a display device according to another embodiment.

FIG. 3 is a cross-sectional view illustrating a display area and a pad area of a display device according to another embodiment.

Referring to FIG. 3, the display device may include the substrate 110, the buffer layer 120, the metal layer BM, the driving element 300, the gate insulating layer 130, the interlayer insulating layer 140, the protective layer 170, the planarization layer 180, the emission element 400, the connection pad PD, the pixel defining layer PDL, and the like. The driving element 300 may include the active layer AP, the gate electrode GE, the source pattern SE, and the drain pattern DE. The emission element 400 may include the lower electrode 190, the emission layer 210, and the upper electrode 220. However, the display device of FIG. 3 may be substantially the same as or similar to the display device 100 described with reference to FIG. 2 except for the drain pattern DE and the connection pad PD. Hereinafter, overlapping descriptions will be omitted.

As described in FIG. 2, the drain pattern DE may include a drain layer 160b and a second conductive layer 162 disposed on the drain layer 160b, and the connection pad PD may include a first pad conductive layer 150 and a second pad conductive layer 152 disposed on the first pad conductive layer 150. However, the source pattern SE of FIG. 3 may not include the first conductive layer 161a like the source pattern SE of FIG. 2.

The second conductive layer 162 may be connected to the drain pattern DE through a first contact hole formed by removing a portion of the protective layer 170 in the display area DA. The second pad conductive layer 152 may be connected to the first pad conductive layer 150 through a second contact hole formed by removing a portion of the protective layer 170 in the pad area PA. That is, the second conductive layer 162 may be formed by an etching process different from an etching process of the drain layer 160b, and the second pad conductive layer 152 may be formed by an etching process different from an etching process of the first pad conductive layer 151.

The second conductive layer 162 and the second pad conductive layer 152 may be disposed on the same layer and may include the same material. For example, each of the second conductive layer 162 and the second pad conductive layer 152 may include a transparent conductive material such as indium tin oxide, indium zinc oxide, zinc tin oxide, indium oxide, indium tin zinc oxide, zinc oxide, tin oxide, and the like. These may be used alone or in combination with each other. In an embodiment, each of the second conductive layer 162 and the second pad conductive layer 152 may include indium tin zinc oxide.

FIGS. 4, 5, 6, 7, 8, 9, and 10 are cross-sectional views illustrating a method of manufacturing a display device according to an embodiment.

Figure 4:
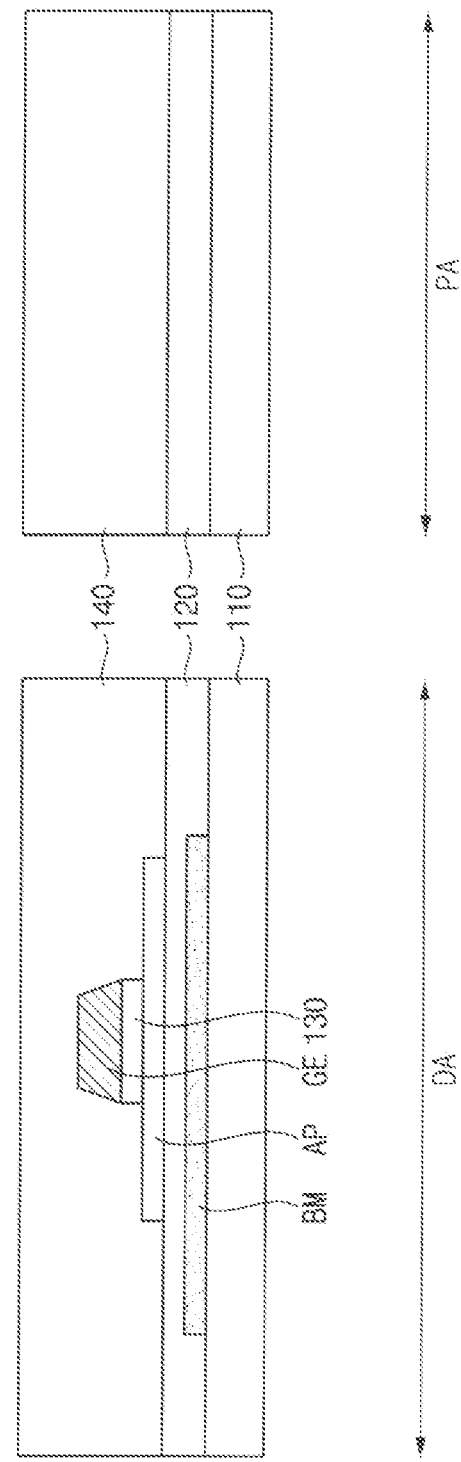
FIGS. 4, 5, 6, 7, 8, 9, and 10 are cross-sectional views illustrating a method of manufacturing a display device according to an embodiment.

Referring to FIG. 4, the substrate 110 including a transparent or opaque material may be provided. The substrate 110 may be divided into the display area DA and the pad area PA. The metal layer BM may be formed in the display area DA on the substrate 110. For example, the metal layer BM may include a metal, an alloy, a metal nitride, a conductive metal oxide, a transparent conductive material, and the like. These may be used alone or in combination with each other. The buffer layer 120 may be formed on the substrate 110. The buffer layer 120 may be entirely formed in the display area DA and the pad area PA. In addition, the buffer layer 120 may cover the metal layer BM in the display area DA. For example, the buffer layer 120 may include an organic material or an inorganic material.

The active layer AP may be formed in the display area DA on the buffer layer 120. The active layer AP may overlap the metal layer BM. That is, the entirety of the active layer AP overlaps the metal later BM. The active layer AP may include a metal oxide semiconductor, an inorganic semiconductor (e.g., amorphous silicon, polysilicon), or an organic semiconductor. The active layer AP may have the source region, the drain region, and the channel region. The channel region may be positioned between the source region and the drain region.

An insulating layer may be formed on the active layer AP. The insulating layer pray cover the active layer AP and may be formed entirely in the display area DA and the pad area PA. The gate electrode GE may be formed in the display area DA on the insulating layer. The gate electrode GE may overlap the channel region of the active layer AP. For example, the gate electrode GE may include a metal, an alloy, a metal nitride, a conductive metal oxide, a transparent conductive material, and the like. These may be used alone or in combination with each other. Then, the insulating layer may be etched using the gate electrode GE as a mask, and thus the active layer AP may be partially exposed. Accordingly, the gate insulating layer 130 may be formed between the gate electrode GE and the active layer AP. For example, the gate insulating layer 130 may include a silicon compound, a metal oxide, and the like. These may be used alone or in combination with each other.

The interlayer insulating layer 140 may be formed on the buffer layer 120. The interlayer insulating layer 140 may be entirely formed in the display area DA and the pad area PA. The interlayer insulating layer 140 may cover the active layer AP and the gate electrode GE. For example, the interlayer insulating layer 140 may include a silicon compound, a metal oxide, and the like. These may be used alone or in combination with each other.

Figure 5:
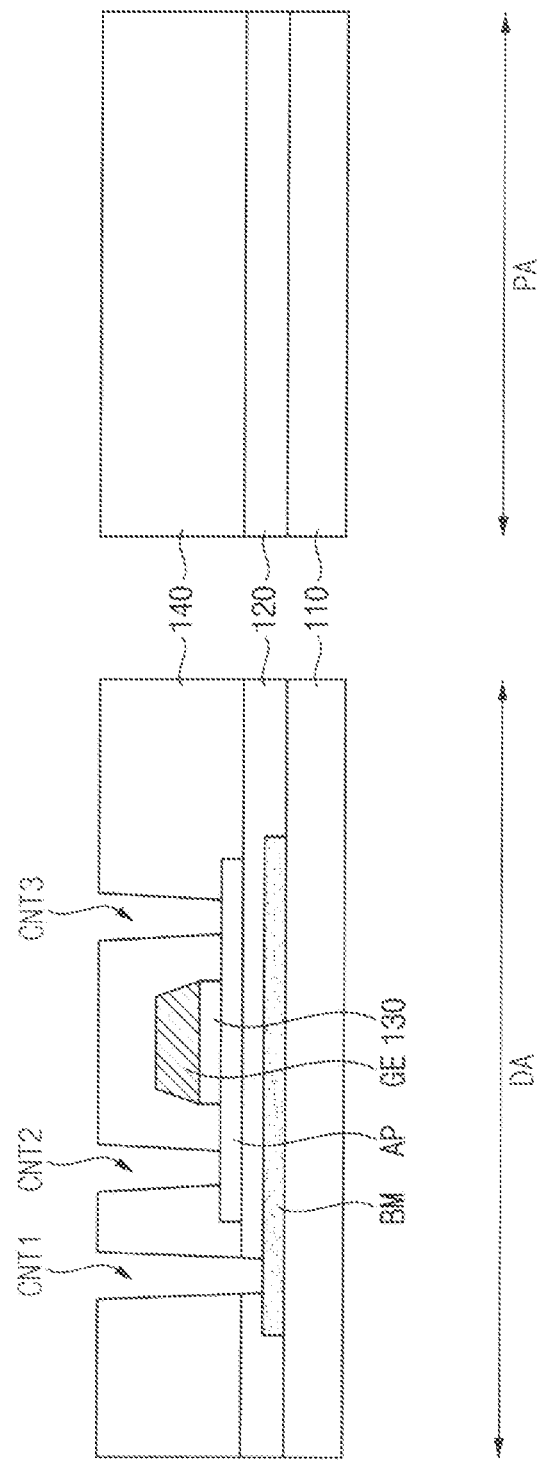

Referring to FIG. 5, a first contact hole CNT1 exposing a portion of the metal layer BM may be formed by removing a portion of the buffer layer 120 and the interlayer insulating layer 140. In addition, a second contact hole CNT2 exposing the drain region of the active layer AP may be formed by removing a first portion of the interlayer insulating layer 140, and a third contact hole CNT3 exposing the source region of the active layer AP may be formed by removing a second portion of the interlayer insulating layer 140. That is, the first to third contact holes CNT1, CNT2, and CNT3 may be simultaneously formed.

Figure 6:
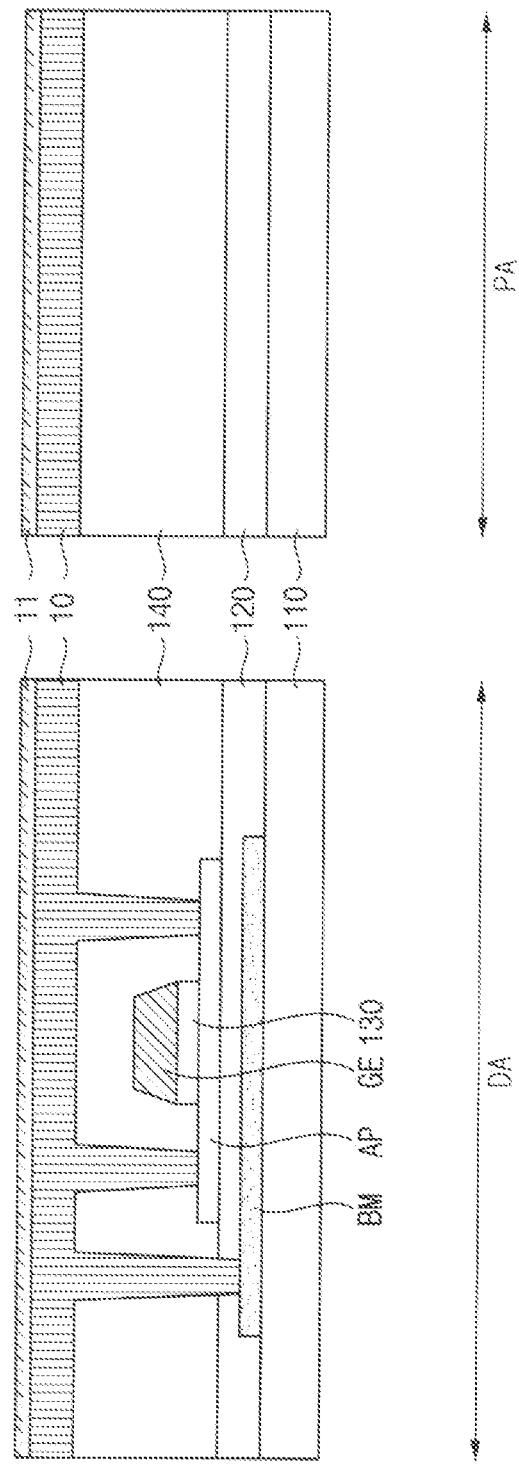

Referring to FIGS. 5 and 6, the first metal layer 10 may be formed on the interlayer insulating layer 140. The first metal layer 10 may be entirely formed in the display area DA and the pad area PA. That is, the first metal layer 10 may be formed entirely in the display area DA and the pad area PA while filling the first to third contact holes CNT1, CNT2, and CNT3. Then, the second metal layer 11 may be formed on the first metal layer 10. The second metal layer 11 may be entirely formed in the display area DA and the pad area PA.

Figure 7:
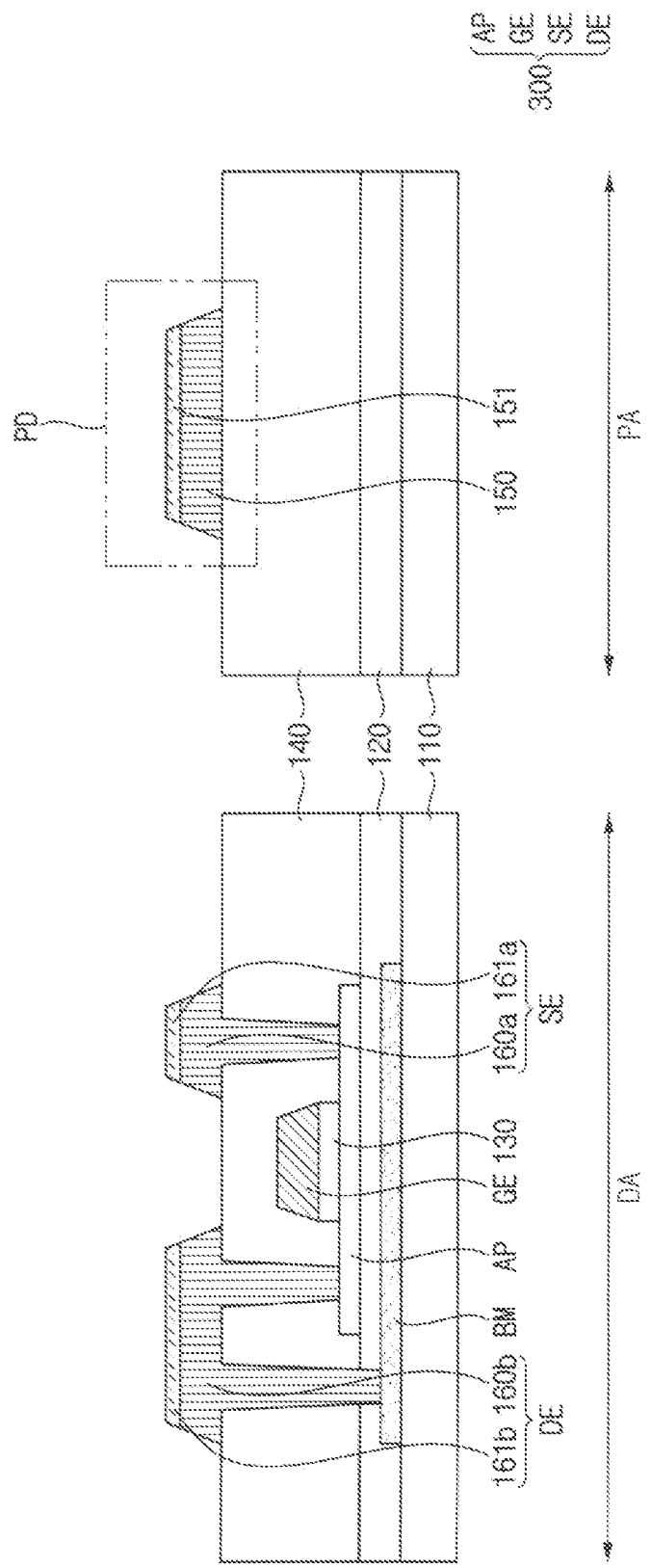

Referring to FIGS. 6 and 7, the source pattern SE and the drain pattern DE may be formed by partially etching the first and second metal layers 10 and 11 in the display area DA. In addition, the connection pad PD may be formed by partially etching the first and second metal layers 10 and 11 in the pad area PA. Here, the source pattern SE, the drain pattern DE, and the connection pad PD may be simultaneously formed by the same etching process. That is, the source pattern SE, the drain pattern DE, and the connection pad PD may be simultaneously formed using the same material. As described above, the source pattern SE may include the source layer 160a and the first conductive layer 161a, the drain pattern DE may include the drain layer 160b and the second conductive layer 161b, and the connection pad PD may include the first pad conductive layer 150 and the second pad conductive layer 151. In an embodiment, each of the source layer 160a, the drain layer 160b, and the first conductive pad conductive layer 150 may include titanium and copper, and each of the first conductive layer 161a, the second conductive layer 161b and the second pad conductive layers 151 may include indium tin zinc oxide.

Figure 8:
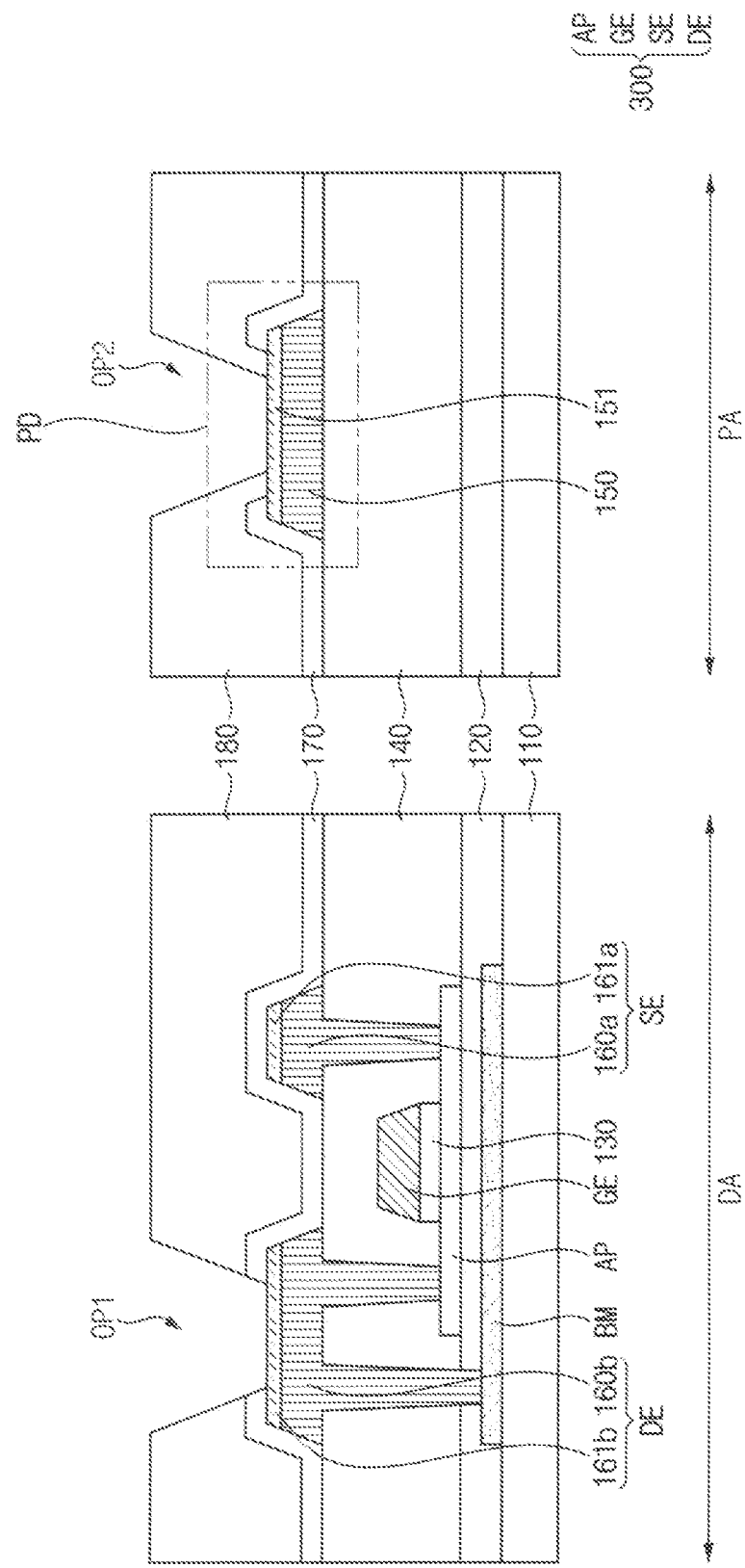

Referring to FIG. 8, the protective layer 170 may be formed on the interlayer insulating layer 140. The protective layer 170 may be entirely formed in the display area DA and the pad area PA. The protective layer 170 may coder the source pattern SE, the drain pattern DE, and the connection pad PD. For example, the protective layer 170 may include a silicon compound, a metal oxide, and the like. These may be used alone or in combination with each other.

The planarization layer 180 may be formed on the protective layer 170. The planarization layer 180 may be entirely formed in the display area DA and the pad area PA. The planarization layer 180 may include an organic material. Examples of the organic material that can be used for the planarization layer 180 may be a photoresist, polyacrylic resin, a polyimide-based resin, a polyamide-based resin, a siloxane-based resin, an acrylic resin, an epoxy-based resin, and the like. Tbc s may be used alone or in combination with each other.

A first opening OP1 exposing a portion of the second conductive layer 161b may be formed by removing a portion of the protective layer 170 and the planarization layer 180. A second opening OP2 exposing a portion of the second pad conductive layer 151 may be formed by removing a portion of the planarization layer 180. That is, the first and second openings OP1 and OP2 may be formed simultaneously.

Figure 9:
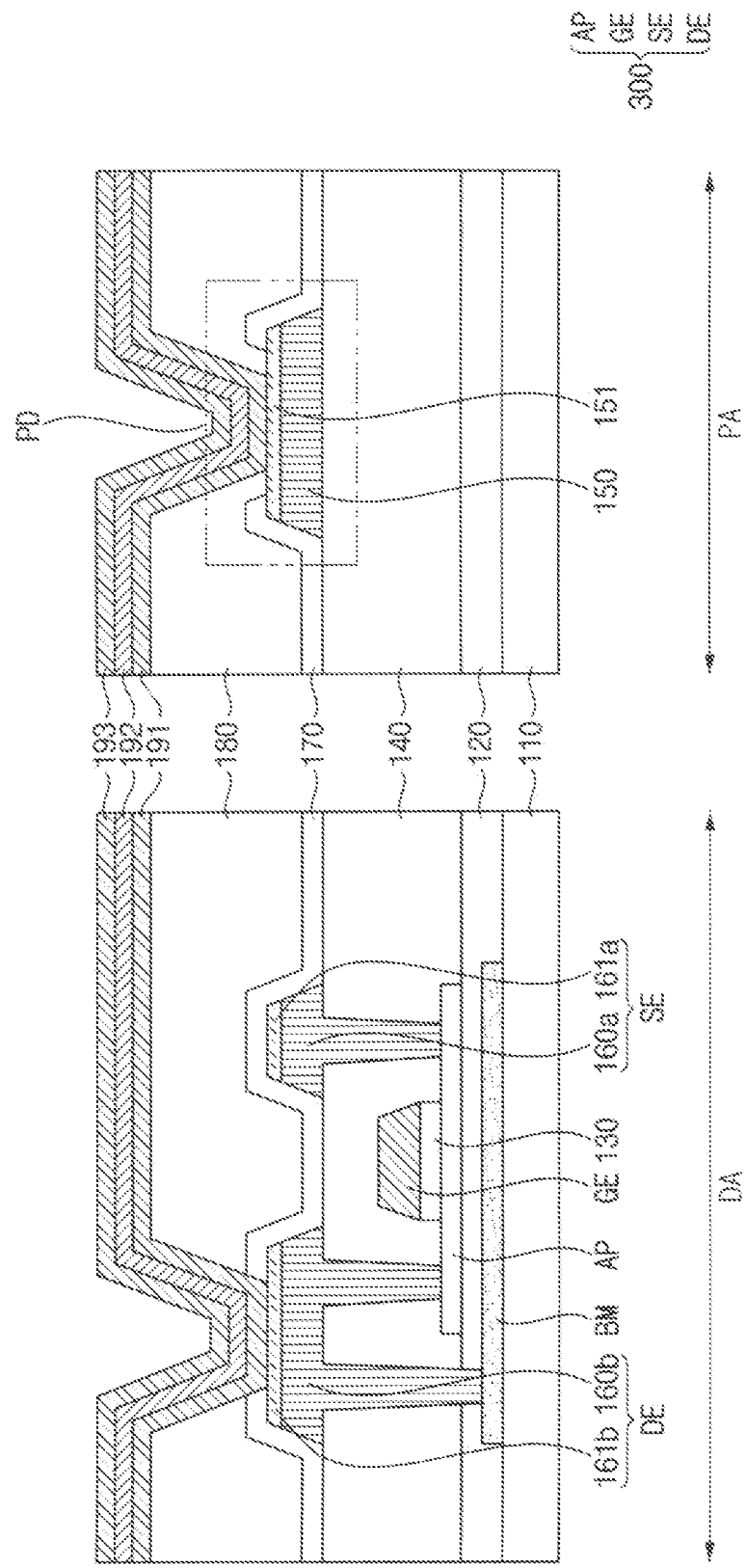

Referring to FIGS. 8 and 9, an electrode layer may be formed on the planarization layer 180. The electrode layer may include a first electrode layer 191, a second electrode layer 192 formed on the first electrode layer 191, and a third electrode layer 193 formed on the second electrode layer 192. The electrode layer may be entirely formed in the display area DA and the pad area PA. That is, the electrode layer may be connected to the second conductive layer 161b through the first opening OP1 and may be connected to the second pad conductive layer 151 through the second opening OP2.

Figure 10:
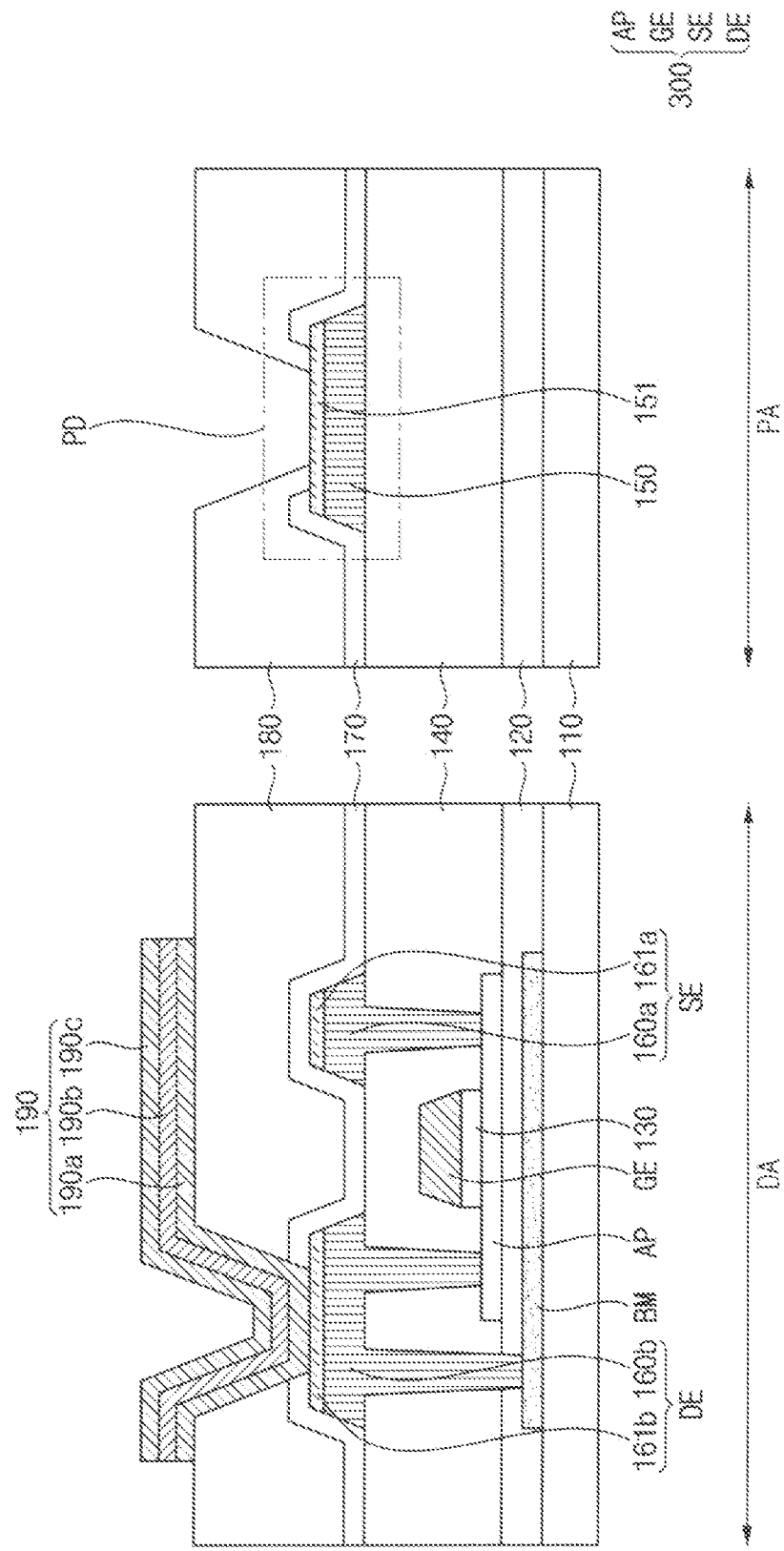

Referring to FIGS. 9 and 10, the lower electrode 190 may be formed by etching a portion of the electrode layer in the display area DA. The lower electrode 190 may include the lower layer 190a, the intermediate layer 190b disposed on the lower layer 190a, and the upper layer 190c disposed on the intermediate layer 190b. In an embodiment, each of the lower layer 190a and the upper layer 190c may include indium tin zinc oxide, and the intermediate layer 190b may include silver. In the pad area PA, the electrode layer may be etched, and thus a portion of the second pad conductive layer 151 may be exposed. That is, in the pad area PA, the entire electrode layer may be etched, and thus the portion of the second pad conductive layer 151 may be exposed.

Referring back to FIG. 2, a pixel defining layer PDL may be formed on the planarization layer 180 and the lower electrode 190. The pixel defining layer PDL may cover both sides of the lower electrode 190 and may expose a portion of the upper surface of the lower electrode 190. The pixel defining layer PDL may include an organic material or an inorganic material. In an embodiment, the pixel defining layer PDL may include an organic material.

The emission layer 210 may be formed on the lower electrode 190 and the pixel defining layer PDL. The emission layer 210 may emit red, green, or blue light. Alternatively, when the emission layer 210 emits white light, the emission layer 210 may include a multilayer structure including a red light emitting layer, a green light emitting layer, and a blue light emitting layer, or a mixed layer of red, green, and blue light emitting materials. The emission layer 210 may include the hole injection layer, the hole transport layer, the organic emission layer, the electron transport layer, and the electron injection layer. For example, the emission layer 210 may include a low molecular weight organic compound or a high molecular weight organic compound.

The upper electrode 220 may be formed on the emission layer 210. The upper electrode 220 may include a metal, an alloy, a metal nitride, a conductive metal oxide, a transparent conductive material, and the like. These may be used alone or in combination with each other. In another embodiment, the upper electrode 220 may have a multilayer structure including a plurality of metal layers. For example, the metal layers may have different thicknesses or may include different materials.

Accordingly, the display device 100 shown in FIG. 2 may be manufactured.

Hereinafter, the lower electrode 190 and the connection pad PD of the display device 100 according to an embodiment of the present disclosure will be described in detail.

Examples 1 to 5

In the display device 100 according to an embodiment of the present disclosure, the lower electrode 190 and the connection pad PD are manufactured as follows, and whether the lower electrode 190 and the connection pad PD are crystallized, a transmittance of the lower electrode 190, a presence or absence of a tip occurrence of the connection pad PD, and a work function of the lower electrode 190 were measured. Here, each of the lower electrode 190 and the connection pad PD was manufactured as an ITZO thin film so that a composition ratio of In, Zn, Sn, and O of each of the lower electrode 190 and the connection pad PD is the same. Table 1 below is data showing the atomic percentages of In, Zn, Sn, and O according to examples 1 to 5.

TABLE 1

|  | In (at %) | Zn (at %) | Sn (at %) | O (at %) |
|---|---|---|---|---|
| Example 1 | 22. | 18.6 | 4.7 | 54.6 |
| Example 2 | 28.7 | 9.5 | 4.8 | 57.0 |
| Example 3 | 33.5 | 3 | 4.9 | 58.6 |
| Example 4 | 22.6 | 18.5 | 4.4 | 54.5 |
| Example 5 | 21.9 | 18 | 5.3 | 54.8 |

Experiment 1—Crystallization of the Lower Electrode and the Connection Pad

The lower electrode 190 and the connection pad PD satisfied the conditions of the example 1. Next, whether the lower electrode 190 and the connection pad PD that satisfy the above conditions were crystallized was checked. Crystallization was performed through X-ray diffraction (XRD) analysis. At this time, a case in which a heat treatment process is performed on the lower electrode 190 and the connection pad PD and a case in which the heat treatment process is not performed were respectively performed. The heat treatment process was carried out at 250° C. for 1 hour.

As a result, a crystallization peak was not observed in the lower electrode 190 and the connection pad PD the case in which the heat treatment process was performed and the case in which the heat treatment process was not performed. That is, a fact that an amorphous state of the lower electrode 190 and the connection pad PD is maintained under the conditions of the example 1 may be confirmed. Through this, a fact that the lower electrode 190 and the connection pad PD satisfying the conditions of the example 1 can be used in the display device 100 may be confirmed.

Experiment 2—Measurement of Transmittance of the Lower Electrode

A thickness of the lower electrode 190 was 150 Å, and the lower electrode 190 satisfied the conditions of the example 1 above. Then, the transmittance of the lower electrode 190 satisfying the above conditions was measured. Specifically, the transmittance of the lower electrode 190 was measured for each wavelength band and was compared with the transmittance of the lower electrode 190 when the lower electrode 190 includes ITO.

Figure 11:
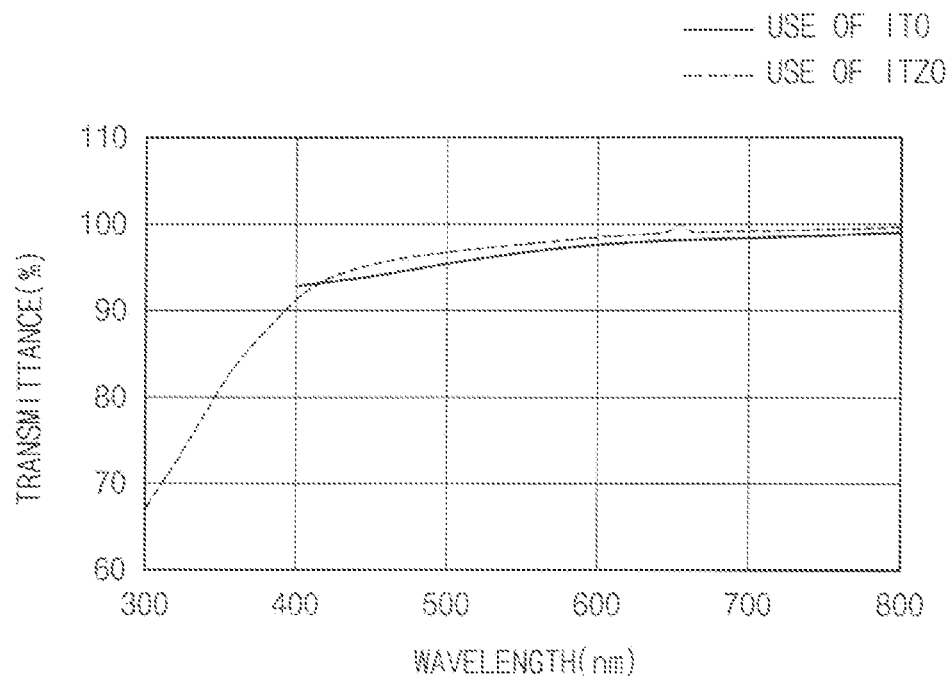
FIG. 11 is a diagram illustrating transmittance of a lower electrode of FIG. 2.

As a result, referring to FIG. 11, when the lower electrode 190 includes ITZO, the transmittance of the lower electrode 190 is 95.04% when the wavelength band is 450 mm, the transmittance of the lower electrode 190 is 97.16% when the wavelength band is 550 mm, the transmittance of the lower electrode 190 is 98.06% when the wavelength band is 650 mm. On the other hand, when the lower electrode 190 includes ITO, the transmittance of the lower electrode 190 is 94.04% when the wavelength band is 450 mm, the transmittance of the lower electrode 190 is 96.62% when the wavelength band is 550 mm, and the transmittance of the lower electrode 190 is 97.90% when wavelength band is 650 mm. That is, when the above condition is satisfied, the transmittance similar to in the case where the lower electrode 190 includes ITO may be confirmed. Through this, a fact that the lower electrode 190 satisfying the condition of the example 1 can be used in the display device 100 may be confirmed.

Experiment 3—The Presence or Absence of a Tip Occurrence of the Connection Pad

The connection pad PD was manufactured using an aqueous etchant. In this case, a thickness of the second pad conductive layer 151 of the connection pad PD was 550 Å, and the connection pad PD satisfied the conditions of the example 1 above. Then, whether or not the tip of the connection pad PD satisfying the above condition was occurred was observed. As a result, when the connection pad PD satisfies the conditions of the example 1, a fact that the tip does not occur in the connection pad PD may be confirmed.

Experiment 4—Measurement of the Work Function of the Lower Electrode

The thickness of the lower electrode 190 was 150 Å. Then, the work function of the lower electrode 190 satisfying the above conditions was measured according to the conditions of the examples 1 to 5. Specifically, the work function of the lower electrode 190 was measured under the conditions of the examples 1 to 5 and was compared with the case where the lower electrode 190 includes ITO.

Figure 12:
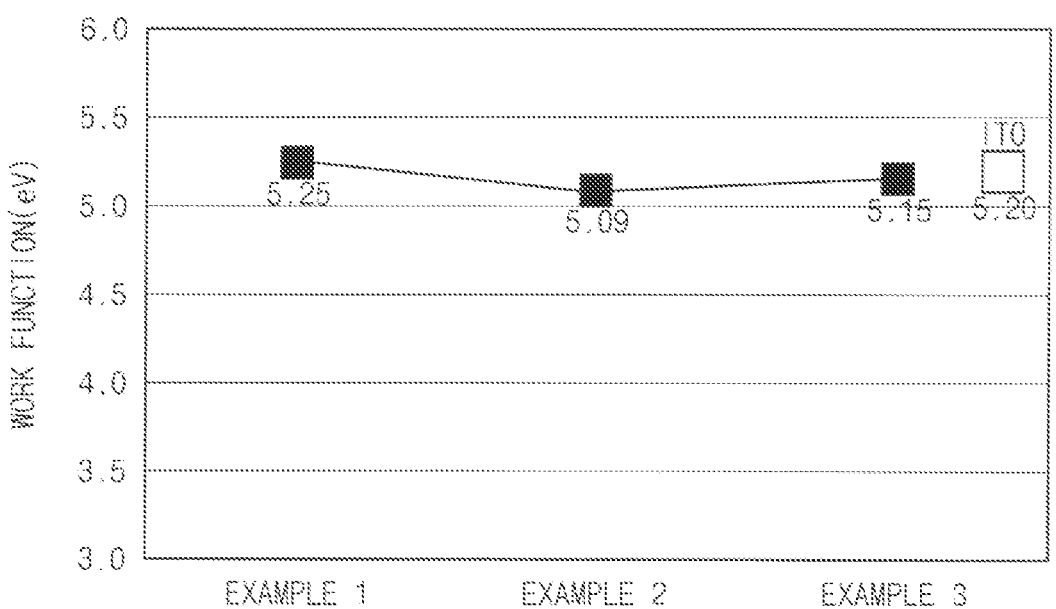
FIGS. 12 and 13 are diagrams illustrating a work function of a lower electrode of FIG. 2.
Figure 13:
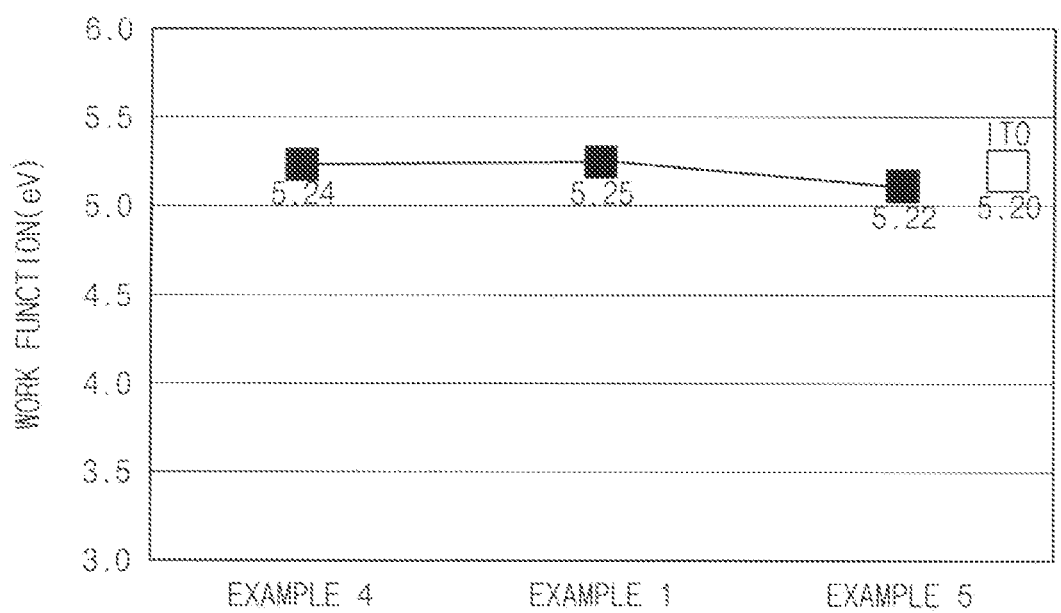

As a result, referring to FIGS. 12 and 13, when the lower electrode 190 satisfies the conditions of the examples 1 to 5, a fact that the work function of the lower electrode 190 satisfies in the range of 5 eV to 5.3 eV tray be confirmed. On the other hand, when the lower electrode 190 includes ITO, the work function of the lower electrode 190 is 5.20 eV.

That is, a fact that the work function of the lower electrode 190 including ITZO satisfying the conditions of the examples 1 to 5 is close to the work function of the lower electrode 190 including ITO may be confirmed. Through this, a fact that the lower electrode 190 satisfying the conditions of the examples 1 to 5 can be used in the display device 100 may be confirmed.

The present disclosure may be applied to a display device and an electronic device including the same. For example, the present disclosure may be applied to high-resolution smartphones, mobile phones, smart pads, smart watches, tablet PCs, vehicle navigation systems, televisions, computer monitors, notebook computers, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:
a driving element disposed in a display area;
an emission element disposed in the display area and electrically connected to the driving element; and
a connection pad disposed in a pad area adjacent to the display area and electrically connected to the driving element,
wherein the connection pad includes a first pad conductive layer having a metal and a second pad conductive layer having indium tin zinc oxide (ITZO), and
wherein the indium tin zinc oxide of the second pad conductive layer includes about 20 at % to about 35 at % of indium (In), about 2 at % to about 20 at % of zinc (Zn), about 4 at % to about 6 at % of tin (Sn), and a remainder of oxygen (O).

2. The display device of claim 1, wherein the emission element includes:
a lower electrode disposed on the driving element;
an emission layer disposed on the lower electrode; and
an upper electrode disposed on the emission layer.

3. The display device of claim 2, wherein the lower electrode includes:
a lower layer including indium tin zinc oxide;
an intermediate layer disposed on the lower layer and including silver (Ag); and
an upper layer disposed on the intermediate layer and including indium tin zinc oxide.

4. The display device of claim 3, wherein a composition ratio of the indium tin zinc oxide included in each of the lower layer and the upper layer has a same as a composition ratio of the indium tin zinc oxide of the second pad conductive layer.

5. The display device of claim 3, wherein a thickness of the lower layer is about 30 Å to about 300 Å, a thickness of the upper layer is about 30 Å to about 500 Å, and a thickness of the second pad conductive layer is about 30 Å to about 2,000 Å.

6. The display device of claim 3, wherein the indium tin zinc oxide of each of the upper layer, the lower layer, and the second pad conductive layer is amorphous.

7. The display device of claim 1, wherein the first pad conductive layer includes titanium (Ti) and copper (Cu).

8. The display device of claim 1, wherein the second pad conductive layer further includes titanium.

9. The display device of claim 1, wherein the driving element includes:
an active layer;
a gate electrode disposed on the active layer; and
a source pattern and a drain pattern disposed on the gate electrode, each of the source pattern the drain pattern connected to the active layer through contact holes penetrating an interlayer insulating layer.

10. The display device of claim 9, wherein the drain pattern includes:
a drain layer having a same material as the first pad conductive layer; and
a conductive layer disposed on the drain layer and having a same material as the second pad conductive layer.

11. The display device of claim 1, further comprising:
an inorganic insulating layer disposed on the driving element and the connection pad and covering the driving element; and
an organic insulating layer disposed on the inorganic insulating layer,
wherein the second pad conductive layer has a exposed portion through an opening formed by removing a portion of the organic insulating layer.

12. A display device comprising:
a driving element disposed in a display area;
a lower electrode disposed on the driving element; and
a connection pad disposed in a pad area adjacent to the display area and electrically connected to the driving element,
wherein the lower electrode includes a lower layer and an upper layer each having indium zinc oxide and an intermediate layer having silver, and
wherein the connection pad includes a first pad conductive layer having a metal and a second pad conductive layer having indium tin zinc oxide in a same composition ration as indium tin zinc oxide of the lower electrode.

13. The display device of claim 12, wherein the indium tin zinc oxide of each of the lower layer, the upper layer and the second pad conductive layer includes about 20 at % to about 35 at % of indium, about 2 at % to about 20 at % of zinc, about 4 at % to about 6 at % of tin, and a remainder of oxygen.

14. The display device of claim 12, wherein the iridium tin zinc oxide of each of the lower layer, the upper layer and the second pad conductive layer is amorphous.

15. The display device of claim 12, wherein the first pad conductive layer includes titanium and copper.

16. The display device of claim 12, wherein the second pad conductive layer further includes titanium.

17. The display device of claim 12, further comprising:
an emission layer disposed on the lower electrode; and
an upper electrode disposed on the emission layer,
wherein the lower electrode, the emission layer, and the upper electrode are defined as an emission element.

18. The display device of claim 12, wherein a thickness of the lower layer is about 30 Å to about 300 Å, a thickness of the upper layer is about 30 Å to about 500 Å, and a thickness of the second pad conductive layer is about 30 Å to about 2,000 Å.

19. The display device of claim 12, wherein the driving element includes:
an active layer;
a gate electrode disposed on the active layer; and
a source pattern and a drain pattern disposed on the gate electrode, each of the source pattern and the drain pattern connected to the active layer through contact holes penetrating an interlayer insulating layer.

20. The display device of claim 19, wherein the drain pattern includes:
a drain layer including a same material as the first pad conductive layer; and
a conductive layer disposed on the drain layer and having a same material as the second pad conductive layer.

* * * * *